(12) United States Patent
Dhakal et al.

(10) Patent No.: US 8,942,308 B2
(45) Date of Patent: Jan. 27, 2015

(54) MULTI-LEVEL CODING AND ITERATIVE DECODING USING SPARSE SPACE CODES

(75) Inventors: Sagar Dhakal, Irving, TX (US); Thomas Aloysius Sexton, Ft. Worth, TX (US); Alireza Bayesteh, Kitchener (CA); Steve Hranilovic, Oakville (CA)

(73) Assignee: BlackBerry Limited, Waterloo, Ontario (CA)

( * ) Notice: Subject to any disclaimer, the term of this patent is extended or adjusted under 35 U.S.C. 154(b) by 31 days.

(21) Appl. No.: 13/558,000

(22) Filed: Jul. 25, 2012
(Under 37 CFR 1.47)

(65) Prior Publication Data

US 2013/0230119 A1    Sep. 5, 2013

Related U.S. Application Data

(60) Provisional application No. 61/511,281, filed on Jul. 25, 2011.

(51) Int. Cl.
| | | |
|---|---|---|
| H04L 27/00 | (2006.01) | |
| H04B 7/04 | (2006.01) | |
| H04B 7/06 | (2006.01) | |
| H04L 1/00 | (2006.01) | |
| H04L 1/06 | (2006.01) | |
| H03M 13/11 | (2006.01) | |

(52) U.S. Cl.
CPC .............. *H04B 7/0456* (2013.01); *H04B 7/061* (2013.01); *H04L 1/0048* (2013.01); *H04L 1/005* (2013.01); *H04L 1/0058* (2013.01); *H04L 1/0618* (2013.01); *H03M 13/1102* (2013.01); *H04B 7/0413* (2013.01)
USPC ........... 375/295; 375/259; 375/260; 375/271; 375/302

(58) Field of Classification Search
CPC .. H04B 7/0639; H04B 7/0452; H04B 7/0456; H04B 7/0632; H04B 7/02; H04B 7/0413; H04B 7/061; H04L 1/0041
USPC .......................... 375/295, 259, 260, 271, 302
See application file for complete search history.

(56) References Cited

U.S. PATENT DOCUMENTS

| | | | | |
|---|---|---|---|---|
| 8,538,335 | B2 * | 9/2013 | Zhang et al. ................. | 455/63.1 |
| 2004/0148560 | A1 * | 7/2004 | Hocevar ........................ | 714/801 |
| 2005/0063484 | A1 * | 3/2005 | Eroz et al. ..................... | 375/271 |
| 2005/0149841 | A1 * | 7/2005 | Kyung et al. ................. | 714/800 |
| 2006/0034381 | A1 * | 2/2006 | Ionescu et al. ................ | 375/267 |

(Continued)

FOREIGN PATENT DOCUMENTS

WO    2012048218 A1    4/2012

OTHER PUBLICATIONS

United States Patent and Trademark Office, "Office Action", issued in connection with corresponding U.S. Appl. No. 13/558,014, dated Mar. 6, 2014. (11 pages).

(Continued)

*Primary Examiner* — Kenneth Lam
(74) *Attorney, Agent, or Firm* — Hanley, Flight & Zimmerman, LLC

(57) ABSTRACT

A multi-level coding and iterative decoding scheme using sparse space codes as the inner-code and codes amenable to belief propagation decoding methods (such as low-density parity-check (LDPC) codes, turbo codes, and trellis codes) as the outer-code is proposed for MIMO communication channels.

8 Claims, 13 Drawing Sheets

(56) References Cited

U.S. PATENT DOCUMENTS

| | | |
|---|---|---|
| 2007/0025467 A1* | 2/2007 | Li .................................. 375/299 |
| 2007/0041458 A1* | 2/2007 | Hocevar et al. ............... 375/260 |
| 2009/0125780 A1* | 5/2009 | Taylor et al. .................. 714/752 |
| 2010/0182950 A1 | 7/2010 | Sexton et al. |
| 2010/0257426 A1* | 10/2010 | Yokokawa et al. ........... 714/752 |
| 2010/0264719 A1* | 10/2010 | Burns et al. ................... 297/487 |
| 2010/0290561 A1* | 11/2010 | Ko et al. ....................... 375/298 |
| 2011/0002278 A1 | 1/2011 | Lindoff et al. |
| 2011/0239075 A1* | 9/2011 | Xu et al. ....................... 714/751 |
| 2011/0299637 A1 | 12/2011 | Buckley et al. |
| 2012/0002564 A1 | 1/2012 | Sexton et al. |
| 2013/0182791 A1 | 7/2013 | Dhakal et al. |
| 2013/0259149 A1 | 10/2013 | Dhakal et al. |

OTHER PUBLICATIONS

Sagar Dhakal and Alireza Bayesteh, "Sparse Space Codes for Multi-Antenna Systems", IEEE Publication, May 2011 (6 pages).

United States Patent and Trademark Office, "Final Office Action", issued in connection with U.S. Appl. No. 13/558,014, dated Aug. 18, 2014 (8 pages).

United States Patent and Trademark Office, "Notice of Allowance", issued in connection with U.S. Appl. No. 13/558,014, dated Oct. 28, 2014 (8 pages).

* cited by examiner

MULTI-LEVEL CODING AND ITERATIVE DECODING USING SPARSE SPACE CODES

CROSS-REFERENCE TO RELATED APPLICATIONS

This application claims the benefit under 35 U.S.C. 119(e) of U.S. Provisional Application No. 61/511,281 filed Jul. 25, 2011, the contents of which are incorporated herein by reference. This application is related to the co-pending application entitled "Multi-user communication using sparse space codes" filed Jul. 25, 2012.

TECHNICAL FIELD

This disclosure is directed in general to communication systems and methods for operating same. More particularly, this disclosure provides systems and methods for encoding and decoding information transmitted using multi-input-multiple-output (MIMO) communication devices.

BACKGROUND

Orthogonal space-time block codes (OSTBC) have traditionally been used to achieve a full diversity gain in multiple-input-multiple-output (MIMO) communication channels.

SUMMARY

In a first aspect, a method of encoding user information for transmission over multiple transmit antennas includes encoding an input word using a low-density parity-check (LDPC) code to form an encoded word, demultiplexing from the encoded word an antenna index and a constellation symbol index, selecting a transmit symbol according to the constellation symbol index and selecting a transmit antenna according to the antenna index. The input word was segmented from the user information. In a second aspect, an apparatus having multiple transmit antennas is operative to perform that method. In a third aspect, a base station having multiple transmit antennas is operative to perform that method.

In a fourth aspect, a method of encoding user information for transmission over multiple transmit antennas includes encoding an input word using a low-density parity-check (LDPC) code to form an encoded word, demultiplexing from the encoded word s antenna indices and s constellation symbol indices, where s is an integer greater than 1, selecting s transmit symbols according to the s constellation symbol indices and selecting s transmit antennas according to the s antenna indices. The input word was segmented from the user information. In a fifth aspect, an apparatus having multiple transmit antennas is operative to perform that method. In a sixth aspect, a base station having multiple transmit antennas is operative to perform that method.

In a seventh aspect, a method of estimating transmitted user information based on received samples from one or more antennas is presented. The method includes evaluating a basis pursuit algorithm with inputs of the received samples and outputs being initial estimated codeword bits, de-mapping the initial estimated codeword bits to produce an estimate of permuted coded bits, calculating posterior probabilities based on the estimate of permuted coded bits, permuting the posterior probabilities for multiple received samples, thus obtaining de-interleaved posterior probabilities, and evaluating a sum-product algorithm with an input comprising the de-interleaved posterior probabilities and outputs being codeword decisions such that estimated transmitted user information is generated. In an eighth aspect, an apparatus is operative to perform that method. In a ninth aspect, a base station is operative to perform that method.

BRIEF DESCRIPTION OF DRAWINGS

FIGS. 9-1 and 9-2 illustrate binary symmetric channels (BSC) with crossover probabilities;

DETAILED DESCRIPTION

Notation: in this document, uppercase letters in bold are used to represent matrices, and lowercase letters in bold are used to represent vectors.

Figure 1:
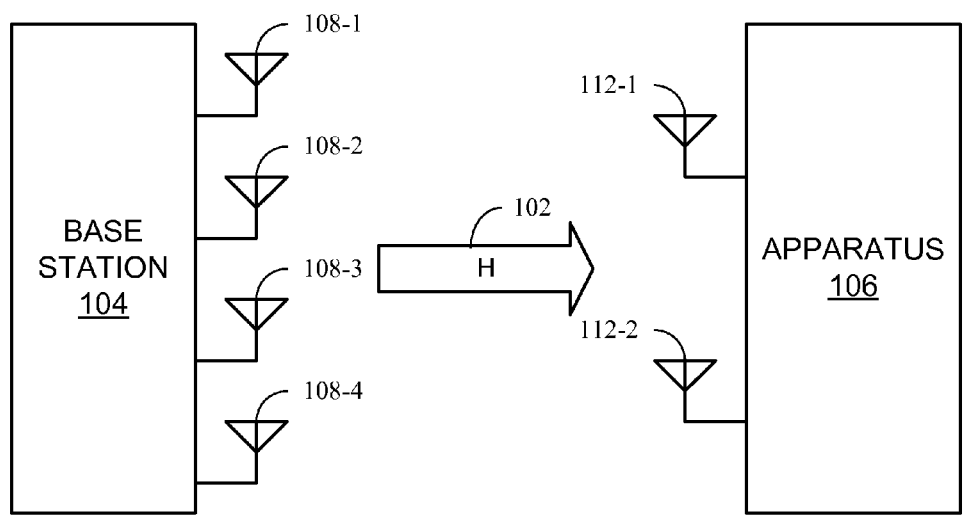
FIG. 1 illustrates an example single user multi-input-multiple-output (SU-MIMO) communication channel between a base station and an apparatus.

FIG. 1 illustrates an example single user multi-input-multiple-output (SU-MIMO) communication channel 102 between a base station 104 and an apparatus 106. In this example, the base station 104 has four transmit antennas 108-1, 108-2, 108-3 and 108-4, and the apparatus 106 has two receive antennas 112-1 and 112-2.

Figure 2:
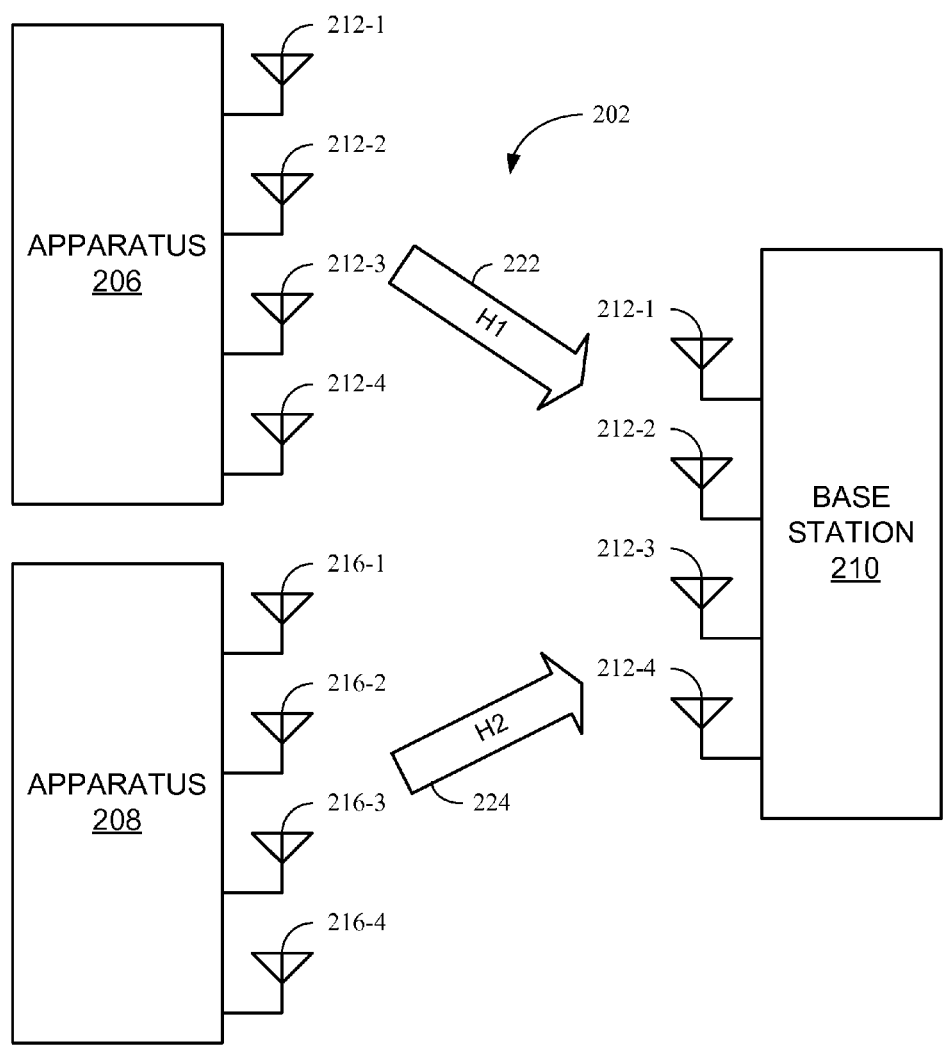
FIG. 2 illustrates an example multiple user MIMO (MU-MIMO) communication channel between two apparatuses and a base station.

FIG. 2 illustrates an example multiple user MIMO (MU-MIMO) communication channel 202 between two apparatuses 206 and 208, and a base station 210. In this example, the base station 210 has four receive antennas 212-1, 212-2, 212-3 and 212-4, the apparatus 206 has four transmit antennas 214-1, 214-2, 214-3 and 214-4, and the apparatus 208 has four transmit antennas 216-1, 216-2, 216-3, and 216-4. The MU-MIMO communication channel 202 is formed from a composition of a SU-MIMO communication channel 222 between the apparatus 206 and the base station 210, and a SU-MIMO communication channel 224 between the apparatus 208 and the base station 210.

In one case, the wireless communication technology used for communications over the SU-MIMO communication channel 102 and the MU-MIMO communication channel 202 may be based on $3^{rd}$ Generation Partnership Project (3GPP) Long Term Evolution (LTE) or LTE-Advanced, or future related standards. 3GPP LTE is also known as Evolved Universal Terrestrial Radio Access (E-UTRA) (Release 8). In this case, the base station 104 and the base station 210 are referred to as evolved base node (eNodeB) and the apparatus 106, 206 and 208 are referred to as user equipment (UE).

In another case, the wireless communication technology used for communications over the SU-MIMO communication channel 102 and the MU-MIMO communication channel 202 may be based on any one or any combination of the IEEE 802.11 family of wireless local area network (WLAN) standards (as described in IEEE Std. 802.11™-2012 published Mar. 29, 2012 by IEEE Computer Society) or future related standards. In particular, IEEE 802.11n, as published in Clause 20 of IEEE Std. 802.11™-2012, is relevant for MIMO communications. In that case, the base station 104, the base station 210, and the apparatus 106, 206 and 208 are referred to stations (STA). For clarity, this document uses the terminology UE and eNodeB, but the techniques described in this document are equally applicable to other wireless communication technologies having MIMO communication channels.

This document proposes multi-user sparse space codes (MU-SSC) as a new transmission scheme for uplink communication over a MU-MIMO communication channel. Results of simulations are presented, demonstrating the simulations simulating two-UE uplink channels where each UE and eNodeB is equipped with 4 antennas.

This document also proposes an iterative coding and decoding scheme for MIMO communication channels using sparse space codes as inner codes and codes amenable to belief propagation decoding methods (such as low-density parity check (LDPC) codes, turbo codes, and trellis codes) as outer codes. Results of simulations for underdetermined SU-MIMO communication channels are presented, demonstrating improved performance relative to SSC coding and decoding techniques that do not use outer codes.

Introduction to Sparse Space Codes (SSC)

Sparse space codes (SSC) for multiple-input-multiple-output (MIMO) communication channels and detector alternatives are described in WO 2012/048218, published Apr. 12, 2012, the contents of which are incorporated herein by reference in their entirety.

When SSC codes are used, the transmit signal is a complex signal vector $f \in C^n$ that has non-zero components when spanned under the arbitrary orthonormal basis $\Psi \in C^{n \times n}$. More precisely, $f = \Psi x$, where x is the s-sparse codeword.

A MIMO channel with m receive antennas and n transmit antennas can be represented by the following relationship:

$$y = Hf + w \quad (1)$$

where f is the transmit signal, H is the independent identically distributed (i.i.d.) complex Gaussian channel, w is the complex Gaussian white noise, and y is the received signal. Because the wireless channel is random Gaussian, with high probability H is always incoherent to any orthonormal basis $\Psi$. It is assumed that the channel H satisfies the restricted isometry property, which is a sufficient criterion for the channel H to become a compressive sampling matrix. Thus there exists an efficient receiver that can utilize knowledge of the channel H and the basis $\Psi$ to detect an s-sparse space codeword x from the under-sampled noisy observation y, where $f = \Psi x$.

A sparse codebook is defined by: (i) a collection of s-sparse space codewords x, (ii) a basis matrix $\Psi$, and (iii) an alphabet constellation A. For example, the Binary Phase Shift Keying (BPSK) constellation consists of the two symbols ±1, the Quadrature Phase Shift Keying (QPSK) constellation consists of the four symbols $$\pm e^{\pm j\frac{\pi}{4}},$$

and the 16-Quadrature Amplitude Modulation (16-QAM) constellation consists of the 16 symbols $$\frac{\{\pm 1 + \pm j; \pm 1 + \pm 3j; \pm 3 + \pm 3j; \pm 3 + \pm j\}}{\sqrt{10}}.$$

The s non-zero elements of the codeword x belong to the constellation A. Let $C(s, \Psi, A)$ denote such a codebook. The total number of codewords in $C(s, \Psi, A)$ is given by the product $$\frac{n!}{(n-s)!s!}|A|^s,$$

where $$\binom{n}{s}$$

term represents the number of unique patterns of s non-zero elements in a vector of size n, and $|A|^s$ represents the number of unique s-tuples, where the elements in each s-tuple are selected from the constellation A. Code sparsity increases information content per codeword by inserting uncertainty in the position of non-zero elements of the codeword. A SSC encoder for an s-sparse space code thus maps $$\left\lfloor \log_2 \left( \frac{n!}{(n-s)!s!} \right) \right\rfloor$$

number of input bits ("the position bits") to a position for the s non-zero elements and maps $\lfloor \log_2 |A|^s \rfloor$ number of input bits ("the symbol bits") to an s-tuple symbol, each symbol drawn from the constellation A. A SSC detector should not only detect the correct transmitted constellation symbol but also the positions of the s symbols in the codeword x. In general, the entropy of an s-sparse space code is:

$$\log_2\left(\frac{n!}{(n-s)!s!}\right) + s\log_2|A| \qquad (2)$$

because the positions of the s symbols in the codeword x also convey information.

The design and performance of 1-sparse space codes will now be disclosed. Specifically, the following discussion will relate to a MIMO channel with n=4 transmit antennas and multiple receive antennas. For s=1, a 1-sparse codebook C(1, Ψ, A) has the following structure:

$$x = \left\{ \begin{pmatrix} a \\ 0 \\ 0 \\ 0 \end{pmatrix}, \begin{pmatrix} 0 \\ a \\ 0 \\ 0 \end{pmatrix}, \begin{pmatrix} 0 \\ 0 \\ a \\ 0 \end{pmatrix}, \begin{pmatrix} 0 \\ 0 \\ 0 \\ a \end{pmatrix} \right\}$$

for all symbols a∈A.

For example, when A represents the QPSK constellation, the sixteen 1-sparse SSC QPSK codewords are $$x = \left\{ \begin{pmatrix} \pm e^{\pm j\frac{\pi}{4}} \\ 0 \\ 0 \\ 0 \end{pmatrix}, \begin{pmatrix} 0 \\ \pm e^{\pm j\frac{\pi}{4}} \\ 0 \\ 0 \end{pmatrix}, \begin{pmatrix} 0 \\ 0 \\ \pm e^{\pm j\frac{\pi}{4}} \\ 0 \end{pmatrix}, \begin{pmatrix} 0 \\ 0 \\ 0 \\ \pm e^{\pm j\frac{\pi}{4}} \end{pmatrix} \right\}$$

All codewords are equally likely to occur, and x provides four bits of entropy per transmission.

In another example, when A represents the BPSK constellation, the eight 1-sparse SSC QPSK codewords are $$x = \left\{ \begin{pmatrix} \pm 1 \\ 0 \\ 0 \\ 0 \end{pmatrix}, \begin{pmatrix} 0 \\ \pm 1 \\ 0 \\ 0 \end{pmatrix}, \begin{pmatrix} 0 \\ 0 \\ \pm 1 \\ 0 \end{pmatrix}, \begin{pmatrix} 0 \\ 0 \\ 0 \\ \pm 1 \end{pmatrix} \right\}$$

All codewords are equally likely to occur, and x provides three bits of entropy per transmission.

Two types of basis functional are used:

(a) Identity basis $$\Psi = \begin{pmatrix} 1 & 0 & 0 & 0 \\ 0 & 1 & 0 & 0 \\ 0 & 0 & 1 & 0 \\ 0 & 0 & 0 & 1 \end{pmatrix};$$

In this representation, f=x, resulting in the transmit signal f having three zeros and one non-zero element, which is the symbol a. Only one power amplifier for the transmit antenna corresponding to the non-zero element of the transmit signal f needs to be turned on. For example, if the non-zero element of the transmit signal f is the first element, then base station 104 transmits the transmit signal f via the transmit antenna 108-1. In this case, where the identity basis is used, the position bits effectively become an index for the antenna that will transmit the symbol selected by the symbol bits.

(b) Fourier basis $$\Psi = \mathcal{F} = \begin{pmatrix} \frac{1}{2} & \frac{1}{2} & \frac{1}{2} & \frac{1}{2} \\ \frac{1}{2} & \frac{1}{2}e^{-j\frac{\pi}{2}} & \frac{1}{2}e^{-j\pi} & \frac{1}{2}e^{-j\frac{3\pi}{2}} \\ \frac{1}{2} & \frac{1}{2}e^{-j\pi} & \frac{1}{2}e^{-j2\pi} & \frac{1}{2}e^{-j3\pi} \\ \frac{1}{2} & \frac{1}{2}e^{-j\frac{3\pi}{2}} & \frac{1}{2}e^{-j3\pi} & \frac{1}{2}e^{-j\frac{9\pi}{2}} \end{pmatrix};$$

Under this transformation, all the elements of the transmit signal f are non-zero and, therefore, all four transmit antennas radiate energy regardless of the symbol position in the 1-sparse space codeword. For example, if $$x = \begin{pmatrix} a \\ 0 \\ 0 \\ 0 \end{pmatrix},$$

then the transmit signal f is the first column of $\mathcal{F}$ scaled by the symbol a, and if $$x = \begin{pmatrix} 0 \\ a \\ 0 \\ 0 \end{pmatrix},$$

then the transmit signal f is the second column of $\mathcal{F}$ scaled by the symbol a.

A maximum likelihood detector (MLD) for a 1-sparse space code performs detection in a single step, which is an exhaustive search to find the minimum distance as given by:

$$(l^*, k^*) = \arg\min_{l \in \{1, \ldots, |A|\}, k \in \{1, \ldots, n\}} \|y - a_l h_k\| \qquad (3)$$

where $a_l$ is the l-th symbol in the constellation A and $h_k$ is the k-th column of channel H. The 1-sparse space codeword detected by the MLD detector has the symbol $a_{l^*}$ in the position $k^*$.

A basis pursuit detector (BPD) for a 1-sparse space code performs detection in two steps. In the first step, the non-zero position k* is detected by choosing the maximum correlation metric as follows:

$$k^* = \arg\max_{k \in \{1, \ldots, n\}} \left| \left\langle y, \frac{h_k}{\|h_k\|} \right\rangle \right| \qquad (4)$$

where $h_k$ is the k-th column of channel H. In the second step, the symbol for the k*-th non-zero position is detected using minimum distance criterion given as:

$$l^* = \arg\min_{l \in \{1, \ldots, |A|\}} \|y - a_l h_{k^*}\| \qquad (5)$$

The 1-sparse space codeword detected by the basis pursuit detector has the symbol $a_{l^*}$ in the position k*.

The basis pursuit algorithm has low computational complexity compared to the MLD algorithm. For example, the number of norm computations required by the MLD algorithm for detecting 1-sparse space codewords is n|A|, whereas the number of norm computations required the basis pursuit algorithm for detecting 1-sparse space codewords is only (n+|A|). However, compared to the MLD algorithm, one major drawback of the basis pursuit algorithm is its suboptimal word error rate (WER) performance.

Description of Multi-User Sparse Space Codes (MU-SSC)

The sparse space codes (SSC) described above and in WO 2012/048218 can be considered as single-user sparse space codes (SU-SSC), applicable both to a scenario in which there is a single-user MIMO communication channel and to a scenario in which only one user in a multi-user MIMO communication channel transmits at any time.

This document describes how sparse space codes can be used in a multi-user MIMO communication channel where multiple UEs, each equipped with multiple transmit antennas, transmit simultaneously and how a single eNodeB, equipped with its multiple receive antennas, can detect what data has been transmitted by the multiple UEs. More specifically, the multiple UEs occupy the same resource block (time frequency slot) when transmitting independent signals over independent channels to the eNodeB. Full channel state information (CSI) is available at the eNodeB, and no CSI is available at any of the multiple UEs.

Each $UE_k$ maps an input word ("user data $m_k$") segmented from its input data stream (also known as its "user information") to an $s_k$-sparse SU-SSC codeword $x_k$ taken from a predefined SSC codebook $C_k(s_k, \Psi, A_k)$. As indicated by the index k, the constellation $A_k$ from which symbols are selected and the sparsity $s_k$ of the SU-SSC codeword $x_k$ may be different for different UEs.

All UEs transmit the UE waveforms corresponding to their SU-SSC codewords simultaneously occupying the same resource block. If K UEs transmit together, then there are K independent UE waveforms transmitted during the same resource block. These UE waveforms combine over the air to produce at the eNodeB a single composite waveform corresponding to a single $\Sigma_{k=1}^{K} s_k$-sparse MU-SSC codeword x that is corrupted by thermal noise, both in the case of the identity basis and in the case of the Fourier basis.

It is assumed that the channel matrix H has the restricted isometry property required for compressive sampling. Thus it is possible to identify that the concatenated channels of all UEs is a compressive sampler of the $\Sigma_{k=1}^{K} s_k$-sparse MU-SSC codeword x.

A detector is used to detect K independent $s_k$-sparse SU-SSC codewords $x_k$ from a noisy $\Sigma_{k=1}^{K} s_k$-sparse MU-SSC codeword x. The detector may implement a maximum likelihood algorithm. Alternatively, the detector may exploit the sparse structure of the MU-SSC codeword x, with some loss in performance relative to the maximum likelihood algorithm. For example, the detector may implement a basis pursuit algorithm or a runner-up basis pursuit algorithm as described in S. Dhakal, A. Bayesteh, "Sparse space codes for multi-antennas systems," *Canadian Workshop in Information Theory (CWIT)*, Kelowna, BC, May 2011. The paper P. Tune, S. R. Bhaskaran and S. Hanly, "Number of measurements in sparse signal recovery", ISIT 2009 makes a correspondence between support recovery in compressed sensing and compound MAC channel in information theory.

Once the detector has detected the K independent $s_k$-sparse SU-SSC codewords $x_k$, the user data $m_k$ for each $UE_k$ can be determined by de-mapping the $s_k$-sparse SU-SSC codewords $x_k$.

Thus the detector implements a method of detecting user data $m_k$ from k=1, ..., K UEs. The detector receives a composite signal over m eNodeB receive antennas in a given reception time interval. The composite signal comprises K UE waveforms arising from each $UE_k$ mapping its user data $m_k$ with a sparse space code of sparsity $s_k$. The detector forms user data candidates $\hat{m}_k$ from the composite signal based on a sum sparsity $\Sigma_{k=1}^{k=K} s_k$, thus obtaining K statistics corresponding to the K user data. For example, the detector may form the user data candidates $\hat{m}_k$ using a maximum likelihood algorithm or a basis pursuit algorithm or a runner-up basis pursuit algorithm or any other algorithm that exploits the sparsity of the coded noisily represented in the composite signal.

Consider the specific case of K=2 UEs and sparsity $s_1=s_2=1$. Two UEs equipped with 4 transmit antennas (for example, the UE 206 and the UE 208) and a single eNodeB equipped with 4 receive antennas (for example, the eNodeB 210). The UE 206 and the UE 208 occupy the same resource block (time frequency slot) when communicating on the uplink with the eNodeB 210.

Each UE independently maps an input word ("user data $m_k$") segmented from its input data stream to a 1-sparse SU-SSC codeword. For example, if BPSK symbols are used in the non-zero position of each 1-sparse SU-SSC codeword x, then each UE maps 3 bits from its input word to select a specific 1-sparse SU-SSC codeword. Two position bits are used to select the non-zero position of the BPSK symbol and one symbol bit is used to select the BPSK symbol. Both the UE 206 and the UE 208 transmit simultaneously on the same resource block. Therefore 6 bits of information are sent together by the two UEs to the eNodeB at every transmission.

For example, UE 206 may map the input word 010 to the 1-sparse SU-SSC codeword:

$$x_1 = \begin{pmatrix} 0 \\ 0 \\ -1 \\ 0 \end{pmatrix}$$

where the position bits 10 are used to select the $3^{rd}$ position in the vector and the symbol bit 0 is used to select the BPSK symbol −1. Assuming an identity basis, the BPSK symbol −1 will be transmitted by the UE 206 via the transmit antenna 212-3, while the remaining transmit antennas 212-1, 212-2 and 212-4 are turned off.

Similarly, the UE 208 may map the input word 111 to the 1-sparse SU-SSC codeword:

$$x_2 = \begin{pmatrix} 0 \\ 0 \\ 0 \\ 1 \end{pmatrix}$$

where the position bits 11 are used to select the $4^{th}$ position in the vector and the symbol bit 1 is used to select the BPSK symbol 1. Assuming an identity basis, the BPSK symbol 1 will be transmitted by the UE 208 via the transmit antenna 216-4, while the remaining transmit antennas 216-1, 216-2 and 216-3 are turned off.

The signal received by the eNodeB 210 is given by:

$$y = H_1 x_1 + H_2 x_2 + w \quad (6)$$

where y is a vector of dimension 4×1 because the eNodeB 210 has four receive antennas, and $H_1$ and $H_2$ are 4×4 channel matrices of the UE 206 and the UE 208, respectively.

Alternatively, the signal received by the eNodeB 210 can be written as:

$$y = Hx + w \quad (7)$$

where H is the concatenated 4×8 channel matrix $H=[H_1|H_2]$, and x is the concatenated vector $x=[x_1^T|x_2^T]^T$. As $x_1$ and $x_2$ are 1-sparse each, the resulting vector x becomes a 2-sparse MU-SSC codeword.

The linear system defined by Equation (7) is underdetermined and the restricted isometry property of H makes it possible to recover a tall vector x (of dimension 8×1) from a short vector y (of dimension 4×1).

With full channel state information (CSI) available at the eNodeB 210, any MU-SSC detector needs to find:

(i) k*: the non-zero position in 1-sparse SU-SSC codeword $x_1$ transmitted by the UE 206;

(ii) l*: the index of the symbol of constellation A in the k*-th position in 1-sparse SU-SSC codeword $x_1$ transmitted by the UE 206;

(iii) v*: the non-zero position in 1-sparse SU-SSC codeword $x_2$ transmitted by the UE 208; and (iv) z*: the index of the symbol of constellation A in the v*-th position in 1-sparse SU-SSC codeword $x_2$ transmitted by the UE 208.

The maximum likelihood detector (MLD) performs an exhaustive search based on the minimum distance criterion given as follows:

$$(l^*,k^*,z^*,v^*)=\arg\min_{\substack{l\in\{1,\ldots,|A_1|\},k\in\{1,\ldots,n_1\},z\in\\ \{1,\ldots,|A_2|\},v\in\{1,\ldots,n_2\}}}\|y-a_l h_k - a_z h_v\| \quad (8)$$

where $h_k$ is the k-th column of the channel matrix $H_1$ and $h_v$ is the v-th column of the channel matrix $H_2$.

Other detectors, such as basis pursuit detectors or runner-up basis pursuit detectors, which can exploit the sparse structure of the MU-SSC codeword, can potentially be used instead of the MLD detector, with some loss in performance.

Simulation Results for Multi-User Sparse Space Codes (MU-SSC)

Monte Carlo simulations were undertaken to evaluate the word error rate (WER) performance of MU-SSC codes. The channel between each transmit-receive antenna pair is assumed to be independent Rayleigh fading. All results were obtained for a two-UE uplink channel, where each UE and eNodeB was equipped with 4 antennas that undergo uncorrelated Rayleigh fading temporally and spatially.

Symbols from the BPSK and QPSK constellations are transmitted in the non-zero positions of MU-SSC codewords. When BPSK symbols are transmitted, each UE achieves an information rate of $\log_2(4\times 2)=3$ bits per channel use, resulting in a sum-rate of 6 bits per channel use. When QPSK symbols are transmitted, each UE achieves an information rate of $\log_2(4\times 4)=4$ bits per channel use, resulting in a sum-rate of 8 bits per channel use.

Figure 3:
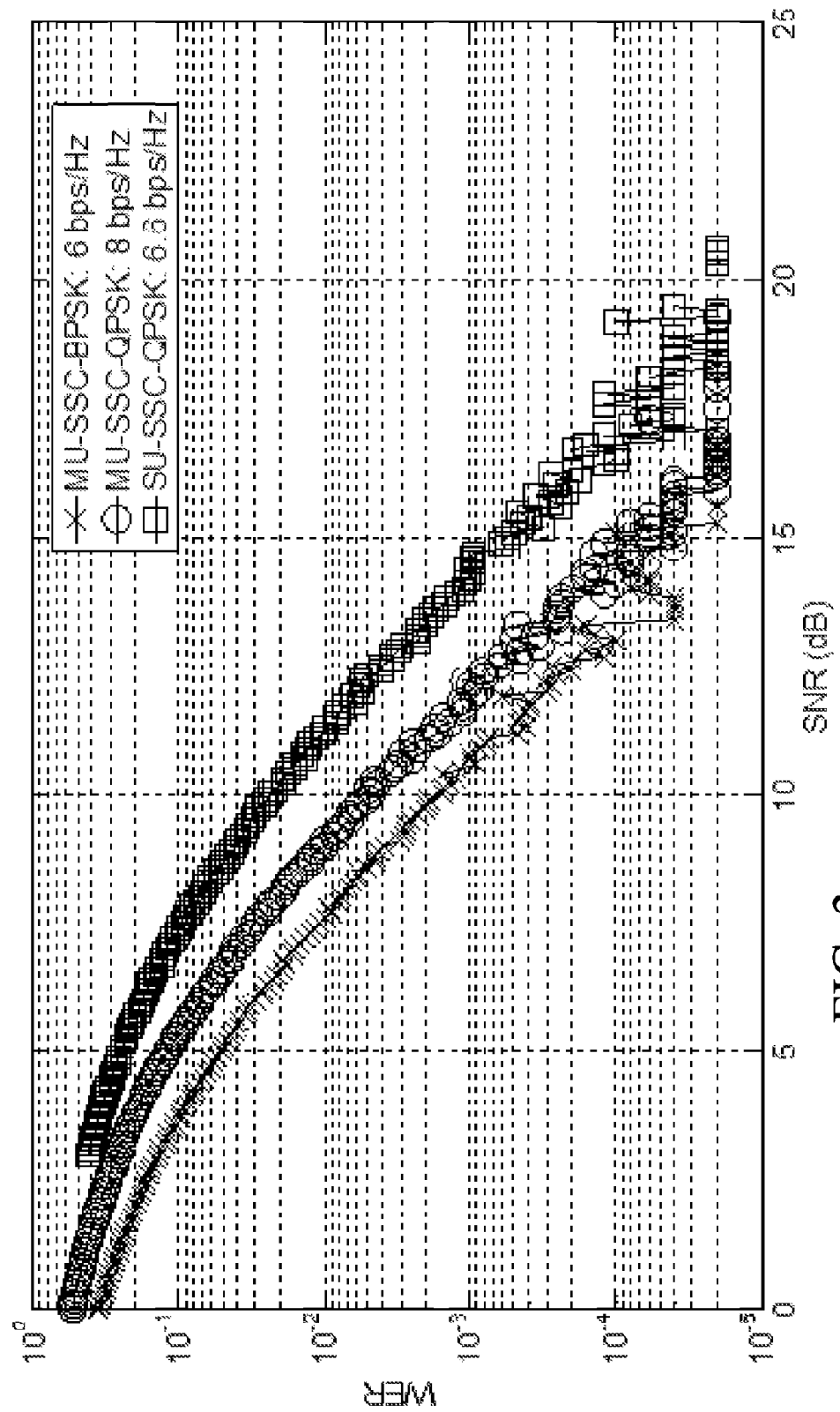
FIG. 3 shows the simulated word error rate (WER) performance of 2-sparse multiple-user sparse space code (MU-SSC) codewords using Binary Phase Shift Keying (BPSK) and Quadrature Phase Shift Keying (QPSK) constellations, and the simulated WER performance of 2-sparse SU-SSC codewords using QPSK, the detection having been performed with a maximum likelihood algorithm.

FIG. 3 shows the WER performance of 2-sparse MU-SSC codewords using BPSK and QPSK constellations, and the WER performance of 2-sparse SU-SSC codewords using QPSK. The detection was performed with a MLD algorithm, as detailed above in Equation (8). It can be observed that MU-SSC codes with QPSK symbols suffer about 1 dB SNR loss to achieve 33% more spectral efficiency compared to MU-SSC codes with BPSK symbols.

The MU-MIMO scenario illustrated in FIG. 2 is reduced to a SU-MIMO scenario in the event that only one UE occupies one resource block, while the other UE remains silent. As the transmitting UE has 4 transmit antennas, the information rate of a 2-sparse SU-SSC code using QPSK symbols is found from Equation (1) to be $$\log_2\left(\frac{4!}{2!2!}\right) + 2\log_2 4 = 6.6$$

bits per channel use. In FIG. 3, SU-SSC QPSK codewords suffer more than 2 dB SNR gap as well as 18% spectral efficiency loss compared to MU-SSC QPSK codewords.

Figure 4:
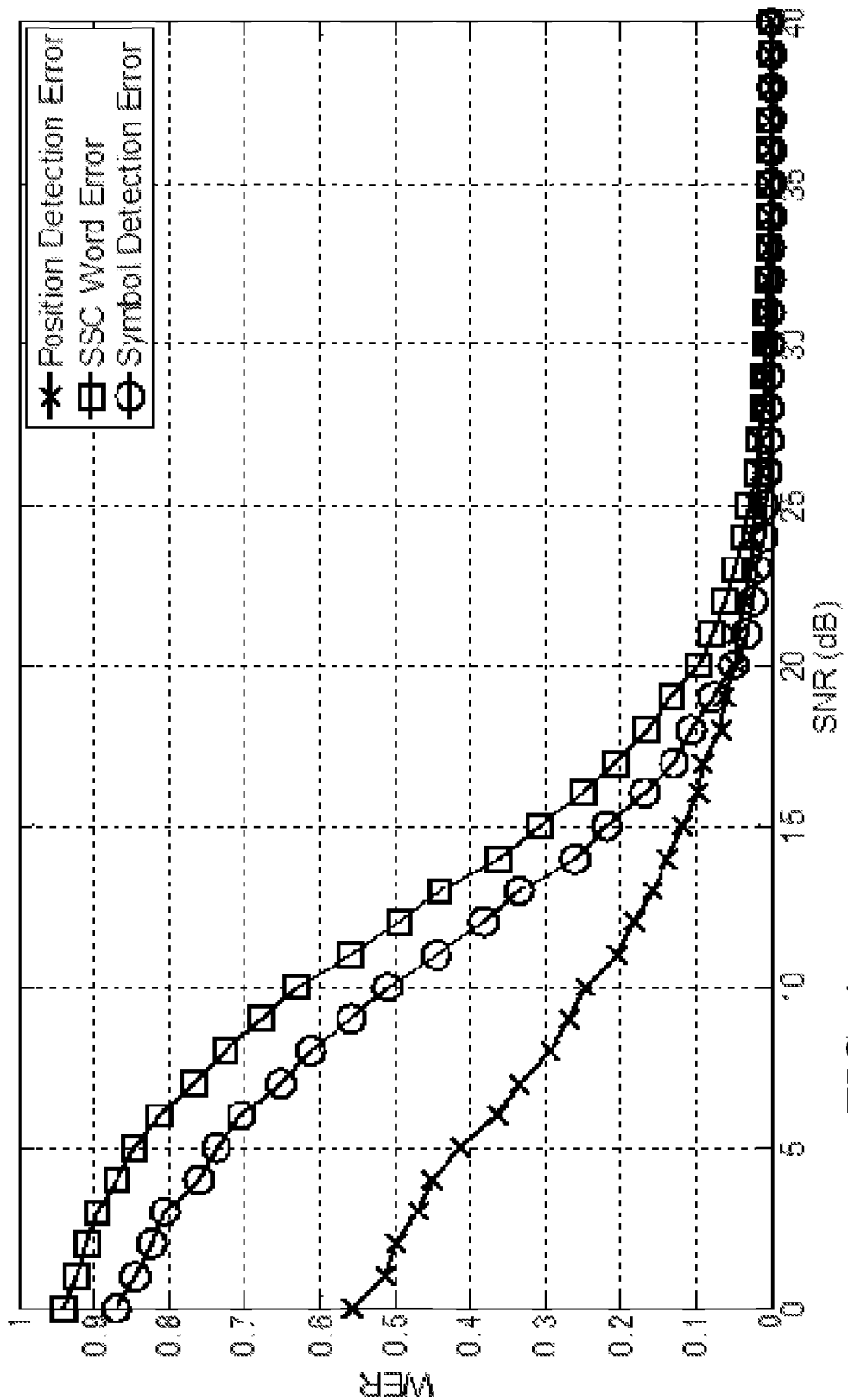
FIG. 4 shows the simulated WER performance for 1-sparse space code 64-QAM (Quadrature Amplitude Modulation) codewords, the detection having been performed with a basis pursuit algorithm.

Multi-Level Coding and Iterative Decoding Scheme with Sparse Space Codes (SSC) as Inner Code The sub-optimal WER performance of BPD (compared to the WER performance of MLD) is attributable to the two-step disjoint detection of the non-zero position in the sparse transmitted vector and the non-zero constellation symbol. In particular, each detection has an unequal error probability. FIG. 4 shows the WER performance for 1-sparse space code 64-QAM codewords, the detection having been performed with the basis pursuit algorithm. The uppermost graph is the word error. The lowermost graph is the position detection error. The middle graph is the symbol detection error. The error rate in detection the position of the non-zero element is much smaller than the error rate in detecting the 64-QAM symbol in the non-zero position. Thus the symbol detection step is the dominant factor in the 1-sparse space code WER performance.

This document proposes a multi-level coding and iterative decoding scheme using sparse space codes as the inner-code and codes amenable to belief propagation decoding methods (such as low-density parity-check (LDPC) codes, turbo codes, and trellis codes) as the outer-code. The following description uses a low-density parity-check (LDPC) code as the outer-code, however, it will be apparent to persons of ordinary skill in the art how to modify the following description for turbo codes or for trellis codes or for any other code amenable to belief propagation decoding methods. For example, encoders and decoders for trellis code modulation (TCM)-based sparse space codes can be designed based on this disclosure using Ungerboeck's mapping-by-set-partitioning approach described in G. Ungerboeck, "Channel coding for multilevel/phase signals", *IEEE Transactions on Information Theory*, v.IT-28, pp. 55-67, January 1982. The iterative decoding scheme initially uses the basis pursuit algorithm to provide the posterior probabilities for bits representing the position of the non-zero element (henceforth "the position bits") as well as the posterior probabilities for bits representing the constellation symbol (henceforth "the symbol bits"). Subsequently, the posterior probabilities for the bits are propagated through the Tanner graph associated with a given parity check matrix of the LDPC code. Thus the posterior probabilities for the position bits iterate along with the posterior probabilities for the symbol bits in order to satisfy all the parity checks. During these iterations, the posterior probabilities for the position bits, which are more reliable, help to increase the reliability of the posterior probabilities for the symbol bits, thus resulting in improved overall performance.

Figure 5:
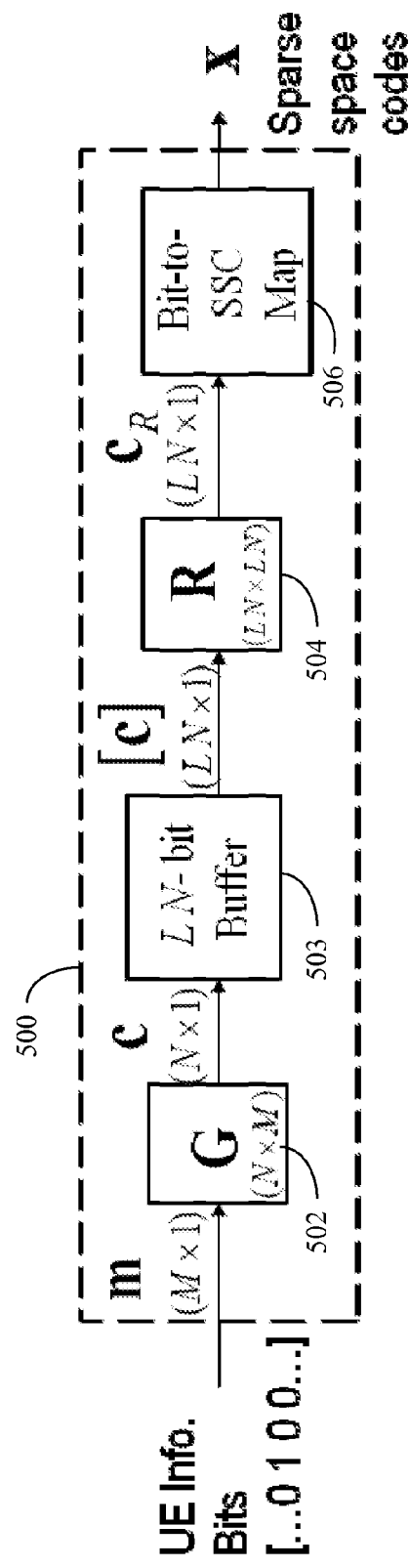
FIG. 5 illustrates an example design for an encoder for low-density parity-check (LDPC)-based sparse space codes (SSCs)
Figure 6:
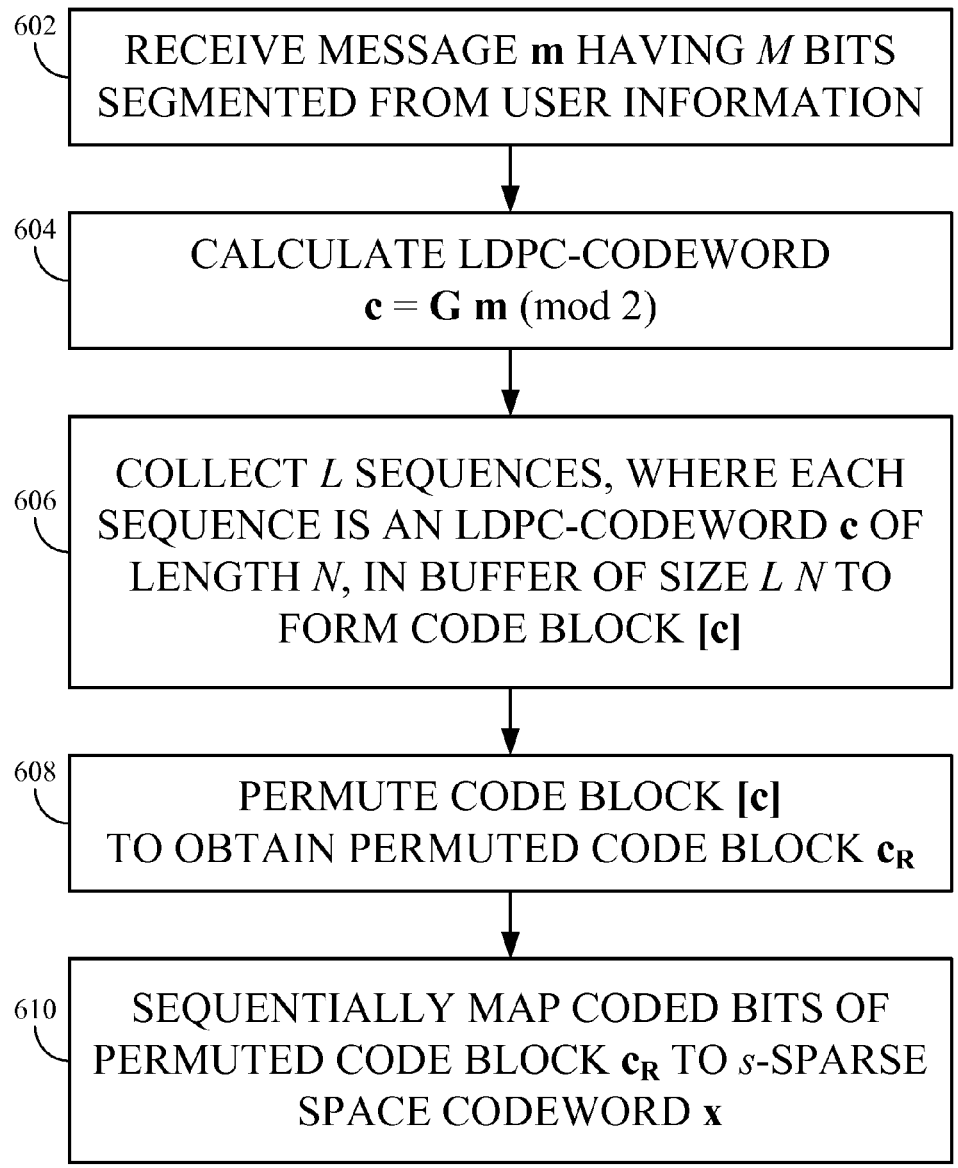
FIG. 6 illustrates an example encoding method for the encoder.

FIG. 5 illustrates an example design for an encoder for LDPC-based SSC codes, applicable to s-sparse codes in general, and FIG. 6 illustrates an example encoding method for the encoder. The encoder is implemented in a baseband processor of an apparatus or base station having multiple transmit antennas, and the encoding method is performed by the baseband processor in preparation for transmission over the multiple transmit antennas. Radio frequency (RF) circuitry, coupled to the baseband processor via a digital-to-RF interface, is coupled to the multiple transmit antennas.

A key property of an LDPC code is its sparse parity check matrix P, from which a generator matrix G can be uniquely determined. The parity check matrix P may be generated randomly, subject to the sparsity constraints. Thus to select a particular LDPC code, one first selects a sparse parity check matrix P of rank K and of dimension K linearly independent rows and N columns. (The rank of a matrix is the number of its linearly independent rows or columns.) The parity check matrix P may be written in the systematic form $[I_K|Q_{K \times M}]$, where $I_K$ is the identity matrix of dimension K rows and K columns and M=N−K. Then the generator matrix G of dimension M columns and N rows that corresponds to the parity check matrix P is given by $$\begin{bmatrix} Q_{K \times M} \\ I_M \end{bmatrix}.$$

An encoder 500 receives (at 602) as input a message m of M information bits. The message is also known as an input word, the input word having been segmented from user information. The encoder 500 comprises an LDPC-generator module 502 to multiply (at 604) the message m by the generator matrix G, thus producing N coded bits in an LDPC-codeword c. An LDPC codeword is also known as an LDPC-encoded word. More precisely, the LDPC-generator module 502 calculates (at 602) c=G m (mod 2). The code rate is M/N.

L sequences, where each sequence is an LDPC codeword c of length N bits, are collected in a buffer 503 of size L N bits to form a code block [c] (at 606). By using the code block [c], the probability of error is independent for consecutive bits produced after deinterleaving (inverse permutation) at the decoder.

The encoder 500 further comprises a permutation module 504 that uses a permutation matrix R of dimension L N rows and L N columns to permute (at 608) the positions of the L N bits in the code block [c], thus obtaining a permuted code block $c_R$. (A permutation matrix is a square binary matrix that has exactly one entry 1 in each row and each column, and 0s elsewhere.) Permutation matrix R is generated randomly before any transmission occurs and is fixed thereafter, so that the same permutation is performed for all messages m. Thus permutation matrix R, which is known at both the transmitter and the receiver, is pseudo-random.

The encoder 500 further comprises a mapping module 506 that uses a bit-to-SSC map to sequentially map (at 610)

$$B = \left\lfloor \log_2\left(\frac{n!}{(n-s)!s!}\right) \right\rfloor + \lfloor \log_2 |A|^s \rfloor$$

of the coded bits of the permuted code block $c_R$ to a s-sparse space codeword x, which is the output of the encoder 500. The term "sequentially" is used to indicate that the mapping performed by the mapping module 506 takes into account the order of the coded bits in the permuted code block $c_R$. The number of s-sparse space codewords per permuted code block $c_R$ is given by $$Q = \frac{LN}{B}.$$

In other words, a single permuted code block $c_R$ yields Q s-sparse space codewords, each s-sparse space codeword transmitted in its own transmission. The value for L is chosen so that (i) the code block size is long enough to go over many fading cycles, and (ii)

$$Q = \frac{LN}{B}$$

is an integer. The mapping of B coded bits of the permuted code block $c_R$ to a s-sparse space codeword x is deterministic, based on an s-sparse space codebook with a look-up table and based on constellation labelling, the codebook and labels having been generated before any transmission. Thereafter, the codebook and labels are fixed. For every transmission, the mapping module 506 takes $$B = \left\lfloor \log_2\left(\frac{n!}{(n-s)!s!}\right) \right\rfloor + \lfloor \log_2 |A|^s \rfloor$$

bits from the permuted code block $c_R$ and matches these bits to a label in the look-up table and picks a corresponding s-sparse space codeword, where $$\left\lfloor \log_2\left(\frac{n!}{(n-s)!s!}\right) \right\rfloor$$

of the B bits are mapped to s non-zero positions in the codeword and $\lfloor \log_2 |A| \rfloor$ of the B bits are mapped to s symbols in the constellation A. In the case that the sparsity s equals 1, the position bits that are mapped to the non-zero position in the codeword serve as an antenna index according to which a transmit antenna is selected, and the symbol bits that are mapped to the symbol in the constellation A serve as a constellation symbol index according to which a transmit symbol is selected. Thus the antenna index and the constellation symbol index are demultiplexed from the B bits of the permuted code block $c_R$. In the case that the sparsity s is greater than 1, the position bits that are mapped to the s non-zero positions in the codeword serve as s antenna indices according to which s transmit antennas are selected, and the symbol bits that are mapped to the s symbols in the constellation A serve as s constellation symbol indices according to which s transmit symbols are selected. Thus the antenna indices and the constellation symbol indices are demultiplexed from the B bits of the permuted code block $c_R$.

The method of FIG. 6 is for each new message m of M information bits to be encoded.

Figure 7:
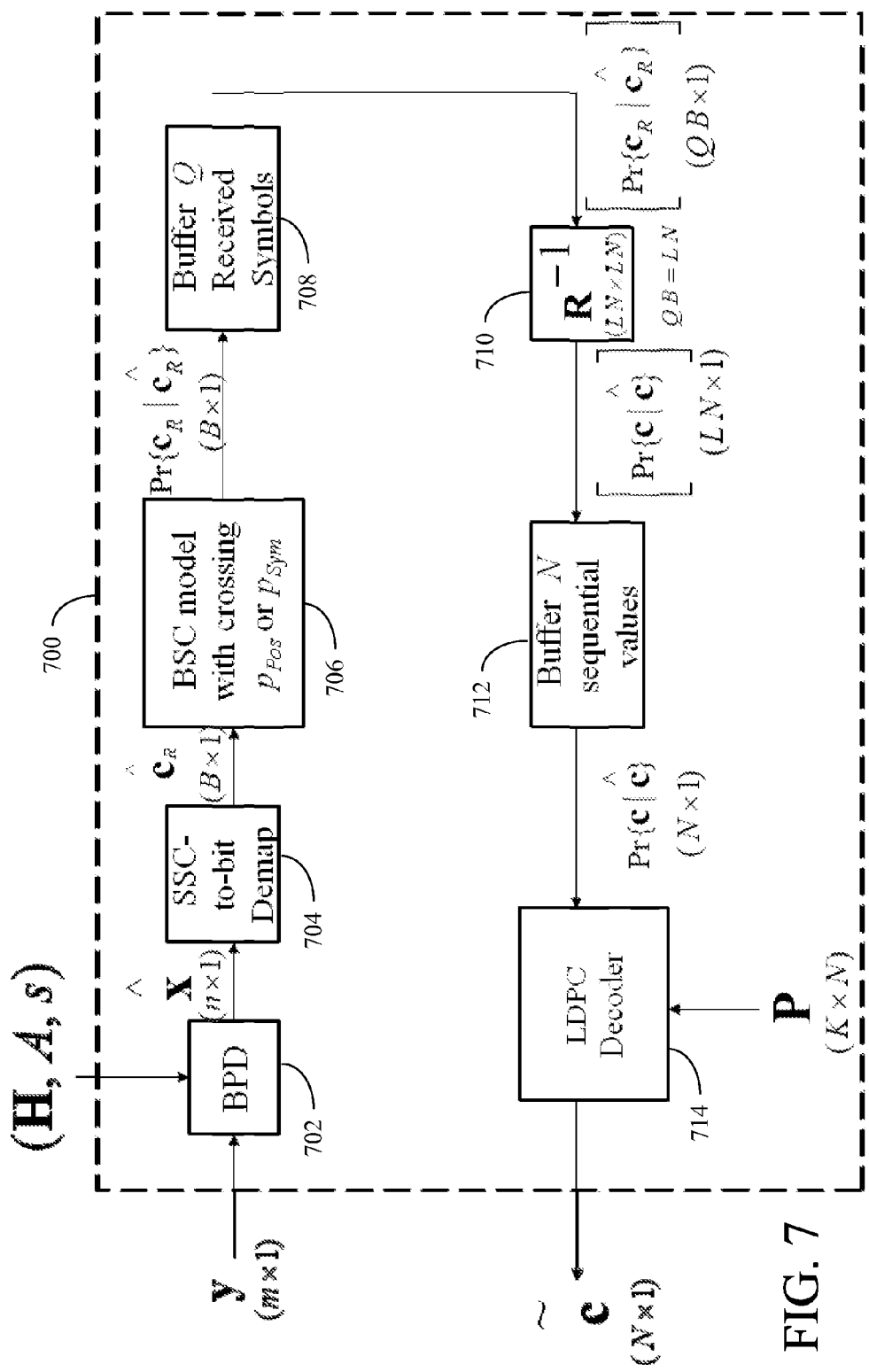
FIG. 7 illustrates an example design for an iterative decoder for LDPC-based SSCs.
Figure 8:
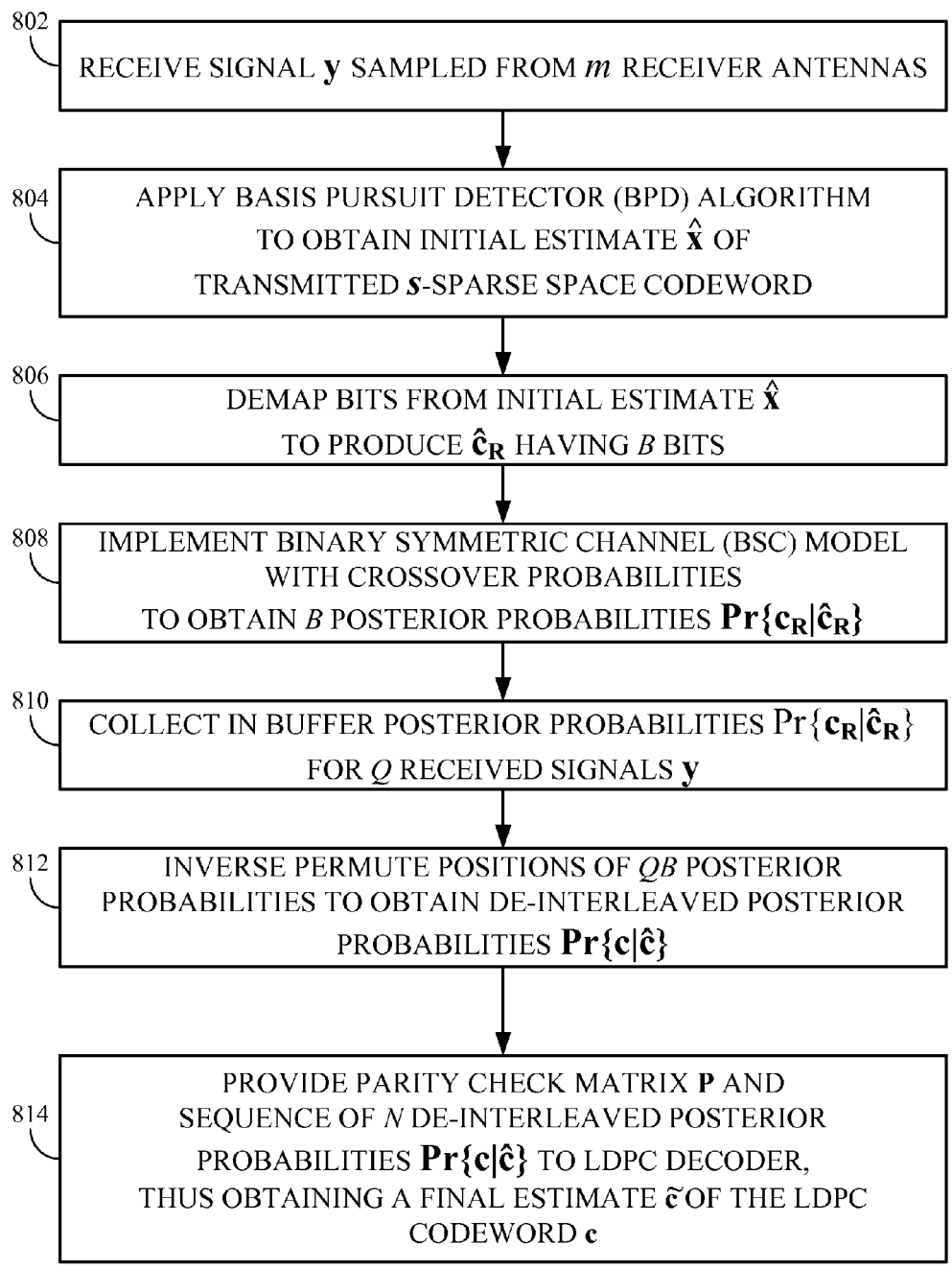
FIG. 8 illustrates an example decoding method for the decoder.

FIG. 7 illustrates an example design for an iterative decoder for LDPC-based SSC codes, applicable to s-sparse codes in general, and FIG. 8 illustrates an example decoding method for the decoder. The decoder is implemented in a baseband processor of an apparatus or base station having multiple receive antennas, and the decoding method is performed by the baseband processor in response to reception by the multiple receive antennas. RF circuitry, coupled to the baseband processor via an RF-to-digital interface, is coupled to the multiple receive antennas.

A decoder 700 receives (at 802) as input a received signal y sampled from m receive antennas.

The decoder 700 comprises a BPD module 702 to apply (at 804) the basis pursuit algorithm (described in WO 2012/048218 and elsewhere) to obtain an initial estimate x̂ of the s-sparse space codeword that was transmitted. BPD module 702 is provided with H (channel estimate of the independent identically distributed complex Gaussian channel), the constellation A, and the number s of non-zero elements in each s-sparse space codeword (in this example, s=1). In other words, BPD module 702 uses Equation (4) above to detect an initial estimate of the non-zero position k* and uses Equation (5) above to detect an initial estimate of the symbol a in the k*-th position.

The decoder 700 further comprises a de-mapping module 704 that uses a SSC-to-bit de-map (the reverse of the bit-to-SSC map used by the mapping module 506) to de-map (at 806) bits from the estimate $\hat{x}$ to produce an estimate $\hat{c}_R$ having B bits. For example, if the number of transmit antennas is n=4, the position k* of the non-zero element of the estimate $\hat{x}$ is de-mapped to the first two bits (that is, $\log_2 4$) of $\hat{c}_R$ and the symbol a in the k*-th position is de-mapped to the remaining $\log_2 |A|$ bits of $\hat{c}_R$. (In the absence of any noise w and if the channel H did not introduce any errors, the B de-mapped bits of $\hat{c}_R$ would be identical to the corresponding B bits of the permuted code block $c_R$ output by the permutation module 504.)

The decoder 700 further comprises a module 706 that implements (at 808) a binary symmetric channel (BSC) model with crossover probability in order to obtain B posterior probabilities $\Pr\{c|\hat{c}\}$ (one probability for each of the position bits and the symbol bits). Such a model is described in further detail with respect to FIGS. 9-1 and 9-2. The output of the module 706 is collected (at 810) in a buffer 708 for Q received signals y, so that the buffer 708 contains Q B=L N posterior probabilities, representing the L N bits of a single permuted code block $c_R$ output by the permutation module 504.

The decoder 700 further comprises a permutation module 710 that uses the permutation matrix $R^{-1}$ (the inverse of the permutation matrix R used by the permutation module 504) to permute (at 812) the positions of the QB posterior probabilities taken from the buffer 708, thus obtaining L N de-interleaved posterior probabilities, representing the L N bits of the code block [c] collected in the buffer 503.

A sequence of N de-interleaved posterior probabilities are taken from a buffer 712 and provided (at 814), along with the parity check matrix P of the LDPC-code, to any suitable LDPC decoder 714. For example, the LDPC decoder 714 may be a sum-product decoder that implements the sum-product algorithm described at page 648 of T. K. Moon, "Error correction coding", A John Wiley & Sons Inc. 2006, pp. 634-679. Thus, from the L N de-interleaved posterior probabilities, the LDPC decoder 714 will decode L LDPC codewords. The output of the LDPC decoder 714 is a final estimate $\tilde{c}$ of the transmitted LDPC codeword c.

Figures 1, 9:
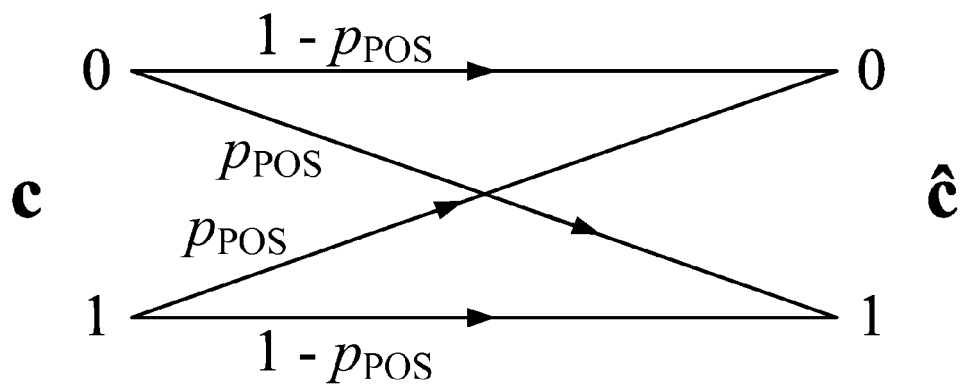
Figures 2, 9:
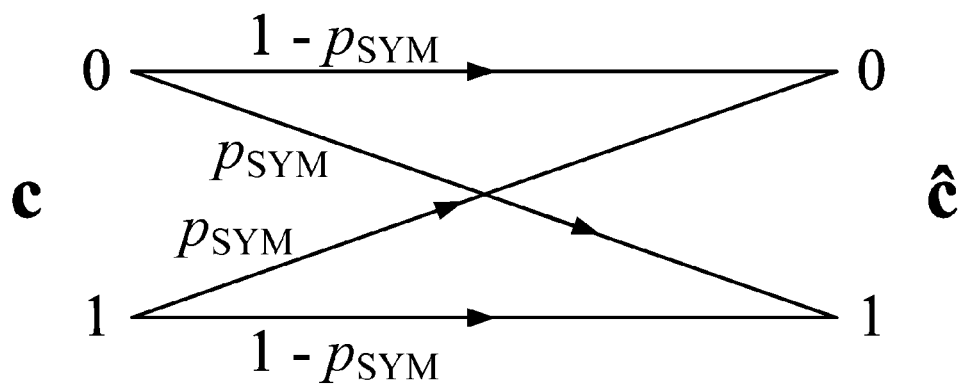

FIG. 9-1 illustrates that:
$\Pr\{c_R=0|\hat{c}_R=0\}=1-p_{POS}$: the posterior probability that a position bit of the transmitted codeword $c_R$ equals 0 when the corresponding bit of the estimated codeword $\hat{c}_R$ equals 0 is $1-p_{POS}$;

(b): $\Pr\{c_R=0|\hat{c}_R=1\}=p_{POS}$ the posterior probability that a position bit of the transmitted codeword $c_R$ equals 0 when the corresponding bit of the estimated codeword $\hat{c}_R$ equals 1 is $p_{POS}$;

(c): $\Pr\{c_R=1|\hat{c}_R=0\}=p_{POS}$ the posterior probability that a position bit of the transmitted codeword $c_R$ equals 1 when the corresponding bit of the estimated codeword $\hat{c}_R$ equals 0 is $p_{POS}$; and (d): $\Pr\{c_R=1|\hat{c}_R=1\}=1-p_{POS}$ the posterior probability that a position bit of the transmitted codeword $c_R$ equals 1 when the corresponding bit of the estimated codeword $\hat{c}_R$ equals 1 is $1-p_{POS}$.

Similarly, FIG. 9-2 illustrates that:
(a): $\Pr\{c_R=0|\hat{c}_R=0\}=1-p_{SYM}$: the posterior probability that a symbol bit of the transmitted codeword $c_R$ equals 0 when the corresponding bit of the estimated codeword $\hat{c}_R$ equals 0 is $1-p_{SYM}$;

(b): $\Pr\{c_R=0|\hat{c}_R=1\}=p_{SYM}$: the posterior probability that a symbol bit of the transmitted codeword $c_R$ equals 0 when the corresponding bit of the estimated codeword $\hat{c}_R$ equals 1 is $p_{SYM}$;

(c): $\Pr\{c_R=1|\hat{c}_R=0\}=p_{SYM}$: the posterior probability that a symbol bit of the L transmitted codeword $c_R$ equals 1 when the corresponding bit of the estimated codeword $\hat{c}_R$ equals 0 is $p_{SYM}$; and (d): $\Pr\{c_R=1|\hat{c}_R=1\}=1-p_{SYM}$: the posterior probability that a symbol bit of the transmitted codeword $c_R$ equals 1 when the corresponding bit of the estimated codeword $\hat{c}_R$ equals 1 is $1-p_{SYM}$.

The crossover probability $p_{POS}$ corresponding to position bits is given by $$p_{POS} = 1 - \left(Pr\{PD\} + \frac{(n/2)-1}{n-1}(1 - Pr\{PD\})\right)$$

where n is the number of transmit antennas and PD represents the occurrence of correct detection of the non-zero position. The crossover probability $p_{POS}$ is constant for a given SNR.

For n=4, it is shown in S. Dhakal, A. Bayesteh, "Sparse space codes for multi-antennas systems," *Canadian Workshop in Information Theory (CWIT)*, Kelowna, BC, May 2011 that the probability of occurrence of correct detection of the non-zero position is given by $$Pr\{PD\} = 1 + 9(1 + SNR)^2 SNR^{-4} \log_2(1 + SNR) - \frac{3}{2}(2SNR^2 + 9SNR + 6)SNR^{-3}$$

where SNR is the signal-to-noise-ratio per received SSC symbol at the receiver, averaged over fading. $SNR=P/N_0$, where P is the transmit power per SSC codeword x, and $N_0$ is the noise power. Thus, responsive to receiving a measurement or other indication of the SNR, the decoder 700 can calculate the value of the crossover probability $p_{POS}$ corresponding to position bits.

In the basis pursuit algorithm, symbol detection (SD) is performed after position detection (PD). Thus, the occurrence of a symbol bit detection (SBD) is split as $$Pr\{SBD\}=Pr\{SBD|PD \text{ occurs}\}+Pr\{SBD|PD \text{ fails}\}(1-Pr\{PD\})$$

If position detection (PD) fails, the decision statistics are random and the detection bit is equally likely to be correct or incorrect. Thus $$Pr\{SBD | PD \text{ fails}\} = \frac{1}{2} \text{ and}$$

$$Pr\{SBD | PD \text{ occurs}\} = Pr\{SD | PD\} + \frac{|A|/2 - 1}{|A| - 1}(1 - Pr\{SD | PD\}).$$

The crossover probability $p_{SYM}$ corresponding to symbol bits is given by $$p_{SYM} = 1 - \left[\left(Pr\{SD|PD\} + \frac{|A|/2-1}{|A|-1}(1 - Pr\{SD|PD\})\right)Pr\{PD\} + \frac{1}{2}(1 - Pr\{PD\})\right]$$

For n=4 transmitter antennas, m=2 receiver antennas, and A is a BPSK constellation, it is shown in S. Dhakal, A. Bayesteh, "Sparse space codes for multi-antennas systems," CWIT 2011, that the conditional probability of symbol detection given the occurrence of correct detection of the non-zero position is given by $$Pr\{SD|PD\} \geq \frac{1}{2} + \frac{1}{2}\sqrt{\frac{SNR}{SNR+1}} + \frac{1}{4}\sqrt{\frac{SNR}{(SNR+1)^3}}$$

Here $SNR = P/N_0$, where P is the transmit power per SSC codeword x, and $N_0$ is the noise power. As this is a tight lower bound on $Pr\{SD|PD\}$, we use it as an equality to evaluate equations given in paragraphs [0093] and [0094] above.

The crossover probability $p_{SYM}$ is constant for a given SNR.

Iterative coding and decoding using sparse space codes as inner codes and codes amenable to belief propagation decoding methods (such as LDPC codes, turbo codes, and trellis codes) as outer codes is applicable also to multi-user MIMO (MU-MIMO) channels. Using the example of LDPC, each UE may have its own iterative encoder for LDPC-based SSCs similar to that illustrated in FIG. 5. Different UEs may use different LDPCs for the outer code. In other words, there is no requirement that all UEs of the MU-MIMO channel use the same LDPC for the outer code. At the eNB, the crossover probabilities for each UE can be independently calculated and fed as input to an appropriate LDPC decoding algorithm for that UE.

Simulation Results

Performance of the joint-coding and iterative-decoding algorithm for LDPC-based 1-sparse space codes is shown using Monte Carlo simulations. All results are obtained for an underdetermined multiple-in-multiple-out (U-MIMO) channel having 4 transmit antennas and 2 receive antennas. The simulations assume that the channels undergo uncorrelated Rayleigh fading temporally and spatially.

Figure 10:
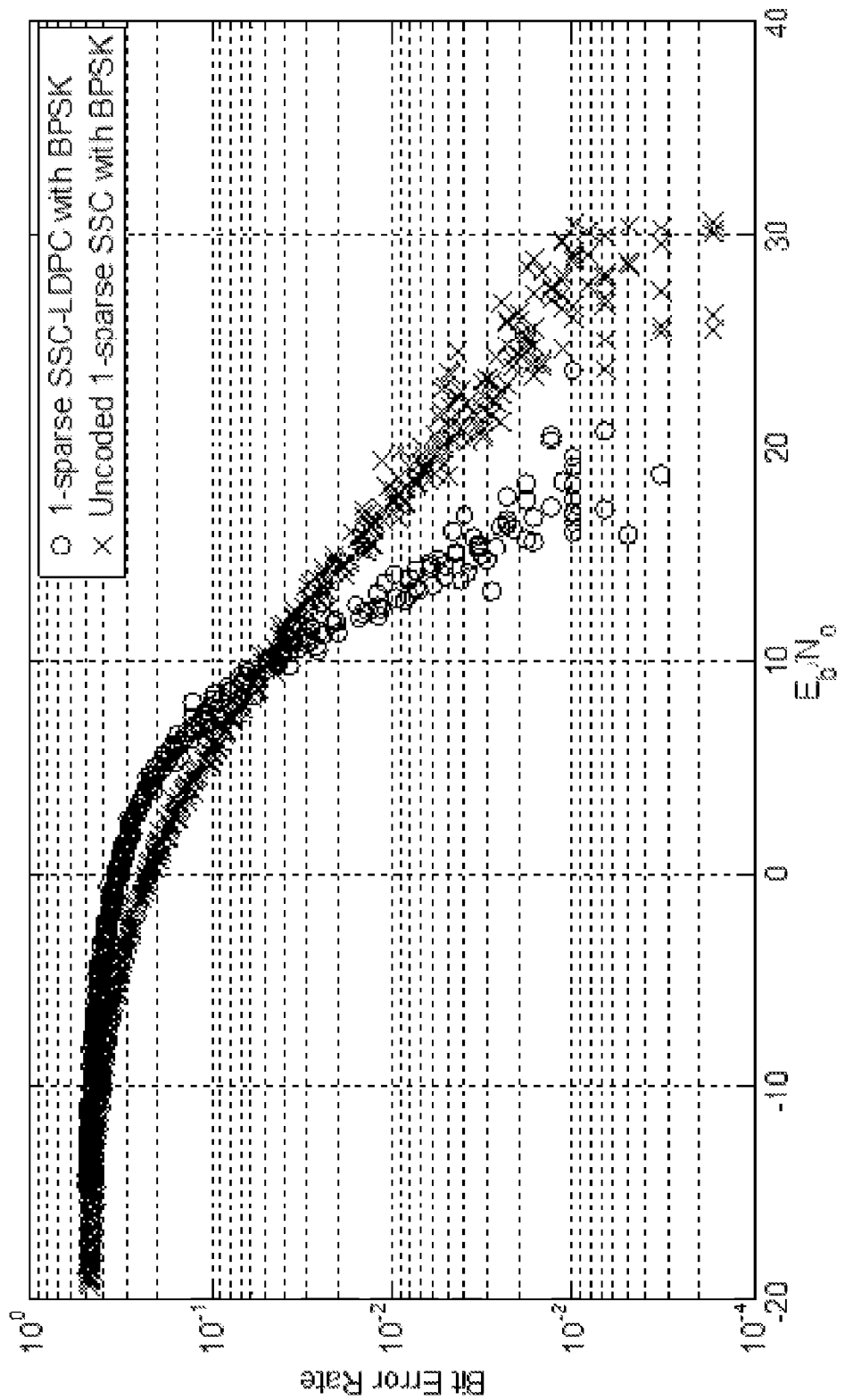
FIG. 10 is a graphical illustration comparing the bit error rate (BER) performance of a 7/20 LDPC-based 1-sparse space code using Binary Phase Shift Keying (BPSK) symbols to the BER performance of a 1-sparse space code using BPSK symbols.
Figure 11:
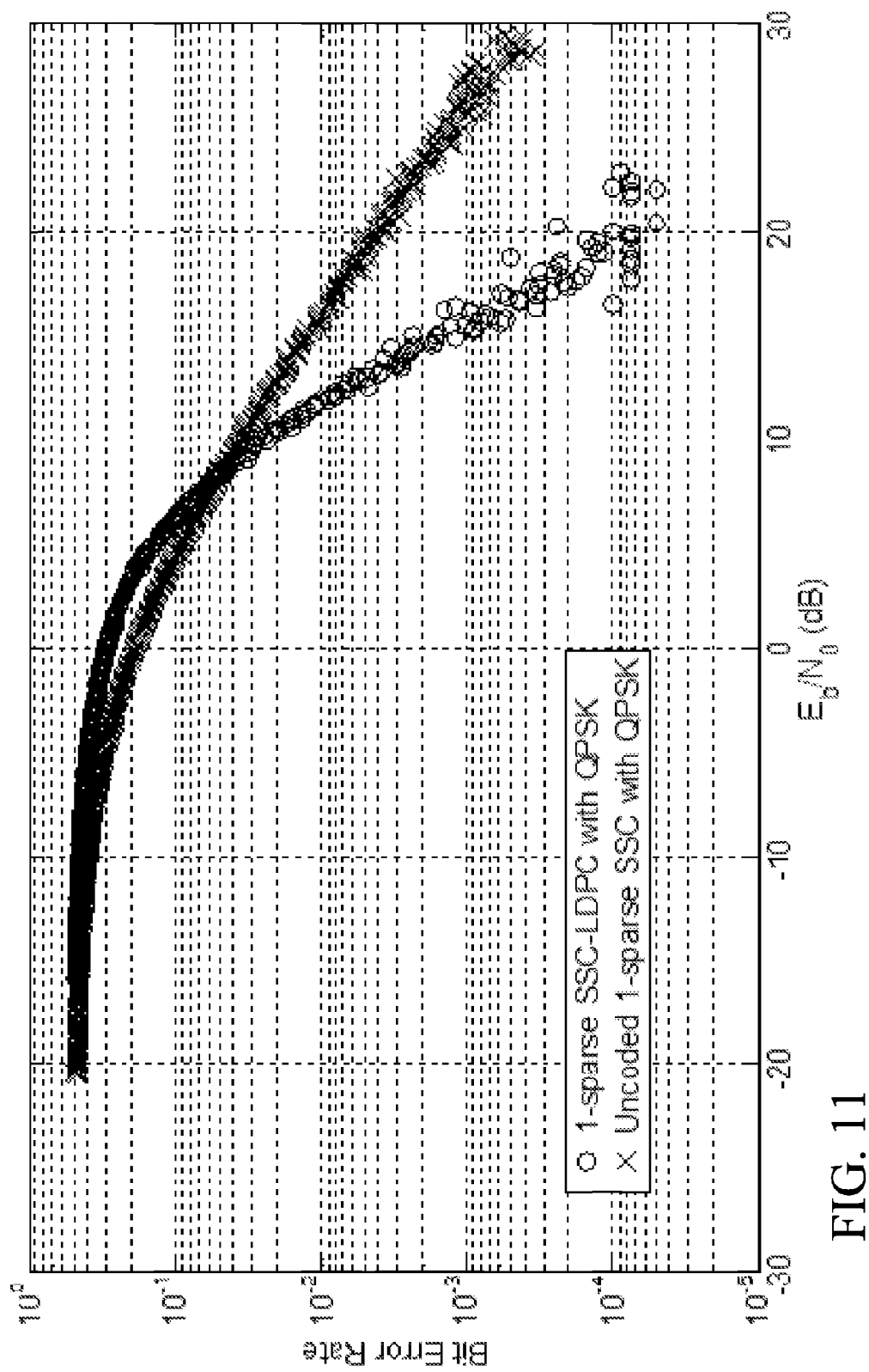
FIG. 11 is a graphical illustration comparing the BER performance of a 7/20 LDPC-based 1-sparse space code using Quadrature Phase Shift Keying (QPSK) symbols to the BER performance of a 1-sparse space code using QPSK symbols.
Figure 12:
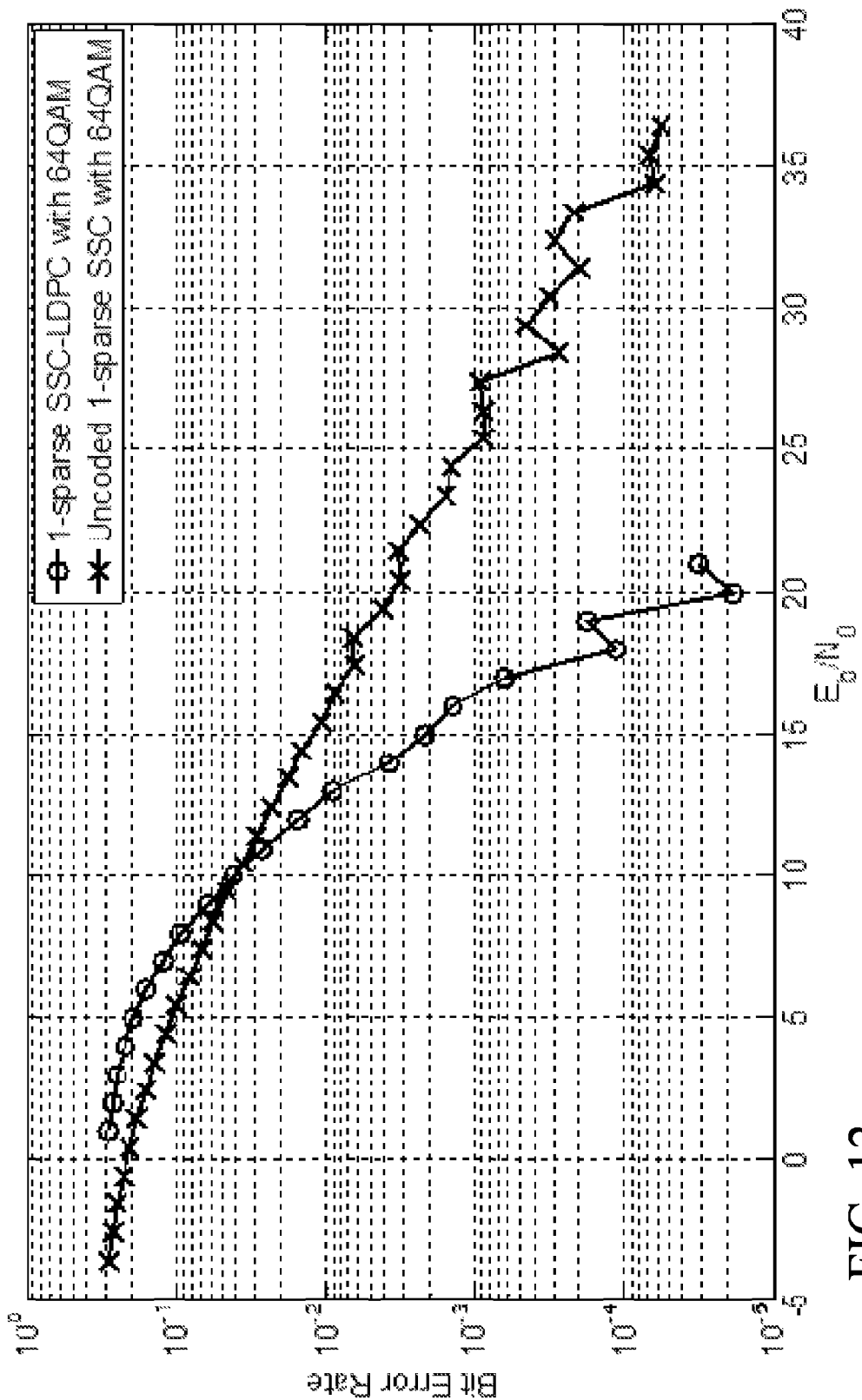
FIG. 12 is a graphical illustration comparing the BER performance of a 7/20 LDPC-based 1-sparse space code using 64-QAM symbols to the BER performance of a 1-sparse space code using 64-QAM symbols.

For the results shown in FIGS. 10, 11 and 12, the following parity check matrix $P_A$ was used, from R. G. Gallagher, "Low-density parity-check codes", *IEEE Transactions on Information Theory*, v.8, pp. 21-28, January 1962.

$$P_A = \begin{pmatrix} 1 & 1 & 1 & 1 & 0 & 0 & 0 & 0 & 0 & 0 & 0 & 0 & 0 & 0 & 0 & 0 & 0 & 0 & 0 & 0 \\ 0 & 0 & 0 & 0 & 1 & 1 & 1 & 1 & 0 & 0 & 0 & 0 & 0 & 0 & 0 & 0 & 0 & 0 & 0 & 0 \\ 0 & 0 & 0 & 0 & 0 & 0 & 0 & 0 & 1 & 1 & 1 & 1 & 0 & 0 & 0 & 0 & 0 & 0 & 0 & 0 \\ 0 & 0 & 0 & 0 & 0 & 0 & 0 & 0 & 0 & 0 & 0 & 0 & 1 & 1 & 1 & 1 & 0 & 0 & 0 & 0 \\ 0 & 0 & 0 & 0 & 0 & 0 & 0 & 0 & 0 & 0 & 0 & 0 & 0 & 0 & 0 & 0 & 1 & 1 & 1 & 1 \\ 1 & 0 & 0 & 0 & 1 & 0 & 0 & 0 & 1 & 0 & 0 & 0 & 1 & 0 & 0 & 0 & 1 & 0 & 0 & 0 \\ 0 & 1 & 0 & 0 & 0 & 1 & 0 & 0 & 0 & 1 & 0 & 0 & 0 & 0 & 0 & 1 & 0 & 0 & 0 \\ 0 & 0 & 1 & 0 & 0 & 0 & 1 & 0 & 0 & 0 & 0 & 0 & 1 & 0 & 0 & 0 & 1 & 0 & 0 \\ 0 & 0 & 0 & 1 & 0 & 0 & 0 & 0 & 0 & 1 & 0 & 0 & 0 & 1 & 0 & 0 & 0 & 1 & 0 \\ 0 & 0 & 0 & 0 & 0 & 0 & 1 & 0 & 0 & 0 & 1 & 0 & 0 & 0 & 1 & 0 & 0 & 0 & 0 & 1 \\ 1 & 0 & 0 & 0 & 0 & 1 & 0 & 0 & 0 & 0 & 1 & 0 & 0 & 0 & 0 & 1 & 0 & 0 & 0 \\ 0 & 1 & 0 & 0 & 0 & 0 & 1 & 0 & 0 & 1 & 0 & 0 & 0 & 1 & 0 & 0 & 0 & 0 \\ 0 & 0 & 1 & 0 & 0 & 0 & 0 & 1 & 0 & 0 & 0 & 1 & 0 & 0 & 0 & 0 & 1 & 0 \\ 0 & 0 & 0 & 1 & 0 & 0 & 0 & 1 & 0 & 0 & 0 & 1 & 0 & 0 & 1 & 0 & 0 & 0 \\ 0 & 0 & 0 & 0 & 1 & 0 & 0 & 0 & 1 & 0 & 0 & 0 & 1 & 0 & 0 & 0 & 0 & 1 \end{pmatrix}$$

Parity check matrix $P_A$ has 3 ones in each column and 4 ones in each row. Therefore, it generates regular LDPC codes. The dimension of parity check matrix $P_A$ is 15 rows and N=20 columns. The rank of parity check matrix $P_A$ is K=13. The corresponding generator matrix G resides in the null-space of $P_A$, that is, $G' P_A = 0$. The dimension of the generator matrix G is N=20 rows and M=7 columns, resulting in a code rate of 7/20.

Using binary phase shift keying (BPSK), QPSK and 64-QAM symbols, respectively, in FIGS. 10, 11 and 12, the bit error rate (BER) performance of LDPC-based 1-sparse space codes are compared to the BER performance of 1-sparse space codes. In all of these cases, the LDPC-based 1-sparse space codes outperform the 1-sparse space codes from 9 dB SNR per bit. However, it should be noted that the curves for the 1-sparse space codes have a larger spectral efficiency compared to the curves for the LDPC-based 1-sparse space codes. For FIG. 10, which is a 7/20 LDPC-based 1-sparse SSC using 4 transmit antennas and BPSK constellation, N=20 and B=3 bits. In simulation, L was 300, therefore there are Q=2000 1-sparse SSC symbols per code block.

Figure 13:
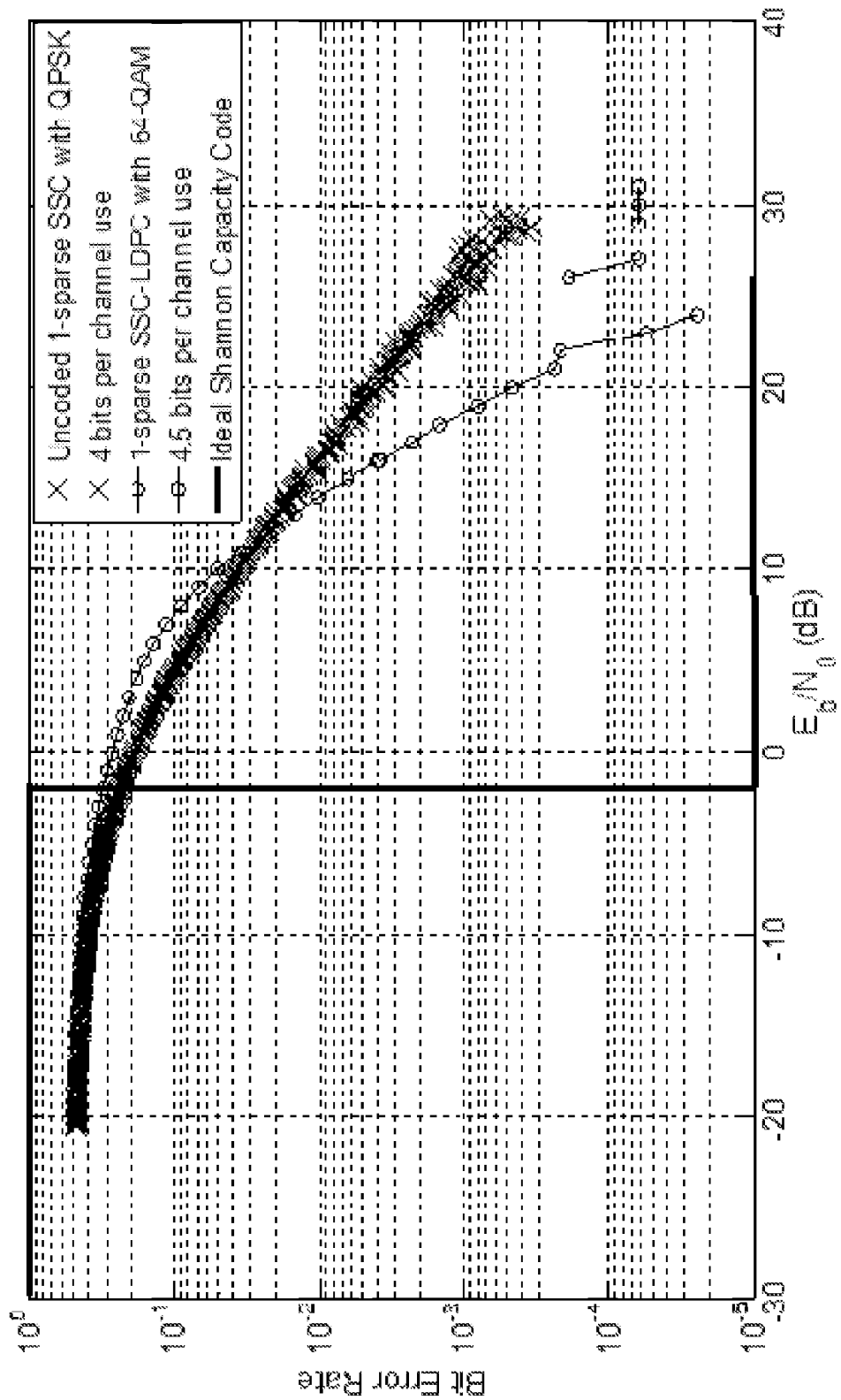
FIG. 13 is a graphical illustration comparing the BER performance of a 5/9 LDPC-based 1-sparse space code using 64-QAM symbols to the BER performance of a 1-sparse space code using QPSK symbols.

For the results shown in FIG. 13, the following parity check matrix $P_B$ was used.

$$P_B = \begin{bmatrix} 1,1,1,1,1,1,0,0,0,0,0,0,0,0,0,0,0,0,0,0,0,0,0,0,0,0,0,0,0,0,0,0,0,0,0,0; \\ 0,0,0,0,0,0,1,1,1,1,1,1,0,0,0,0,0,0,0,0,0,0,0,0,0,0,0,0,0,0,0,0,0,0,0,0; \\ 0,0,0,0,0,0,0,0,0,0,0,0,1,1,1,1,1,1,0,0,0,0,0,0,0,0,0,0,0,0,0,0,0,0,0,0; \\ 0,0,0,0,0,0,0,0,0,0,0,0,0,0,0,0,0,0,1,1,1,1,1,1,0,0,0,0,0,0,0,0,0,0,0,0; \\ 0,0,0,0,0,0,0,0,0,0,0,0,0,0,0,0,0,0,0,0,0,0,0,0,1,1,1,1,1,1,0,0,0,0,0,0; \\ 0,0,0,0,0,0,0,0,0,0,0,0,0,0,0,0,0,0,0,0,0,0,0,0,0,0,0,0,0,0,1,1,1,1,1,1; \\ 1,0,0,0,0,0,1,0,0,0,0,0,1,0,0,0,0,0,1,0,0,0,0,0,1,0,0,0,0,0,1,0,0,0,0,0; \\ 0,1,0,0,0,0,0,1,0,0,0,0,0,1,0,0,0,0,0,1,0,0,0,0,0,1,0,0,0,0,0,1,0,0,0,0; \\ 0,0,1,0,0,0,0,0,1,0,0,0,0,0,1,0,0,0,0,0,1,0,0,0,0,0,1,0,0,0,0,0,1,0,0,0; \\ 0,0,0,1,0,0,0,0,0,1,0,0,0,0,0,1,0,0,0,0,0,1,0,0,0,0,0,1,0,0,0,0,0,1,0,0; \\ 0,0,0,0,1,0,0,0,0,0,1,0,0,0,0,0,1,0,0,0,0,0,1,0,0,0,0,0,1,0,0,0,0,0,1,0; \\ 0,0,0,0,0,1,0,0,0,0,0,1,0,0,0,0,0,1,0,0,0,0,0,1,0,0,0,0,0,1,0,0,0,0,0,1; \\ 1,0,0,0,0,0,0,0,0,0,0,1,0,0,0,0,1,0,0,0,0,1,0,0,0,0,1,0,0,0,0,1,0,0,0,0; \\ 0,1,0,0,0,0,1,0,0,0,0,0,0,0,0,0,0,1,0,0,0,0,1,0,0,0,0,1,0,0,0,0,1,0,0,0; \\ 0,0,1,0,0,0,0,1,0,0,0,0,1,0,0,0,0,0,0,0,0,0,0,1,0,0,0,0,1,0,0,0,0,1,0,0; \\ 0,0,0,1,0,0,0,0,1,0,0,0,0,1,0,0,0,0,1,0,0,0,0,0,0,0,0,0,0,1,0,0,0,0,1,0; \\ 0,0,0,0,1,0,0,0,0,1,0,0,0,0,1,0,0,0,0,1,0,0,0,0,1,0,0,0,0,0,0,0,0,0,0,1; \\ 0,0,0,0,0,1,0,0,0,0,1,0,0,0,0,1,0,0,0,0,1,0,0,0,0,1,0,0,0,0,1,0,0,0,0,0; \end{bmatrix}$$

Parity check matrix $P_B$ generates (3,6) regular LDPC codes. The rank of parity check matrix $P_B$ is K=16. Therefore, the generator from the null-space of $P_B$ is obtained having a dimension of N=36 rows and M=20 columns, resulting in a code rate of $$\frac{20}{36} = \frac{5}{9} = 0.56.$$

The BER performance of LDPC-based 1-sparse space codes using 64-QAM symbols was compared to the BER performance of 1-sparse space codes using QPSK symbols. The LDPC-based 1-sparse space code imparts 4.5 information bits per channel use, which is larger than the spectral efficiency of 4 information bits per channel use corresponding to the 1-sparse space codes with no outer code. Interestingly, the bit error rate characteristic is still preserved with the LDPC-based 1-sparse space coded system outperforming the 1-sparse space coded system starting around 11 dB SNR per bit. Thus the LDPC-based 1-sparse space coded system imparts more information at a lower BER than a 1-sparse space coded system. As noted in WO 2012/048218, a 1-sparse space coded system outperforms OSTBC; thus the LDPC-based 1-sparse space coded system outperforms OSTBC on U-MIMO channels.

What is claimed is:

1. A method of encoding user information for transmission over multiple transmit antennas, the method comprising:
    encoding an input word using a low-density parity-check (LDPC) code to form an encoded word, the input word having been segmented from the user information;
    demultiplexing from the encoded word an antenna index and a constellation symbol index;
    selecting a transmit symbol according to the constellation symbol index; and
    selecting a transmit antenna according to the antenna index, thus encoding the user information for transmission.

2. The method of claim 1, further comprising:
    transmitting the selected transmit symbol from the selected transmit antenna.

3. A method of encoding user information for transmission over multiple transmit antennas, the method comprising:
    encoding an input word using a low-density parity-check (LDPC) code to form an encoded word, the input word having been segmented from the user information;
    demultiplexing from the encoded word s antenna indices and s constellation symbol indices, where s is an integer greater than 1;
    selecting s transmit symbols according to the s constellation symbol indices; and
    selecting s transmit antennas according to the s antenna indices, thus encoding the user information for transmission.

4. The method of claim 3, further comprising:
    transmitting the s selected transmit symbols, each from a corresponding one of the s selected transmit antennas.

5. An apparatus or base station having multiple transmit antennas, the apparatus or base station operative to:
    encode an input word using a low-density parity-check (LDPC) code to form an encoded word, the input word having been segmented from user information;
    demultiplex from the encoded word an antenna index and a constellation symbol index;
    select a transmit symbol according to the constellation symbol index; and
    select a transmit antenna according to the antenna index, thus encoding the user information for transmission.

6. The apparatus or base station of claim 5, further operative to transmit the selected transmit symbol from the selected transmit antenna.

7. An apparatus or base station having multiple transmit antennas, the apparatus or base station operative to:
    encode an input word using a low-density parity-check (LDPC) code to form an encoded word, the input word having been segmented from user information;
    demultiplex from the encoded word s antenna indices and s constellation symbol indices, where s is an integer greater than 1;
    select s transmit symbols according to the s constellation symbol indices; and
    select s transmit antennas according to the s antenna indices, thus encoding the user information for transmission.

8. The apparatus or base station of claim 7, further operative to transmit the s selected transmit symbols, each from a corresponding one of the s selected transmit antennas.

* * * * *